(12) United States Patent
Merritt

(10) Patent No.: US 6,197,620 B1
(45) Date of Patent: Mar. 6, 2001

(54) METHOD OF MANUFACTURING A SINGLE DEPOSITION LAYER METAL DYNAMIC RANDOM ACCESS MEMORY

(75) Inventor: Todd A. Merritt, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/228,595

(22) Filed: Jan. 12, 1999

Related U.S. Application Data

(62) Division of application No. 08/871,362, filed on Jun. 9, 1997, now Pat. No. 5,903,491.

(51) Int. Cl.⁷ .................................................. H01L 21/82
(52) U.S. Cl. ............................................................ 438/129
(58) Field of Search .................................. 438/129, 128, 438/130–132, 238; 365/51, 53, 208

(56) References Cited

U.S. PATENT DOCUMENTS

| | | | |
|---|---|---|---|
| 3,740,732 | 6/1973 | Frandon | 340/173 |
| 4,314,894 | 2/1982 | Schmelzer et al. | 204/192 |
| 4,862,245 | 8/1989 | Pashby et al. | 357/70 |
| 4,910,866 | 3/1990 | Allen | 29/827 |
| 4,949,161 | 8/1990 | Allen et al. | 357/70 |
| 4,957,878 | 9/1990 | Lowery et al. | 437/52 |

(List continued on next page.)

FOREIGN PATENT DOCUMENTS

| | | | |
|---|---|---|---|
| 3447722 | 7/1985 | (DE) | G11C/11/34 |
| 0317161 | 5/1989 | (EP) | H01L/27/10 |
| 0364186 | 4/1990 | (EP) | G11C/7/00 |
| 0461313 | 12/1991 | (EP) | G11C/11/409 |
| 0487468 | 5/1992 | (EP) | H01L/27/115 |
| 62-114121 | 5/1987 | (JP) | 360/131 |

OTHER PUBLICATIONS

"Micron Technology, Inc.", *Micron Technology, Inc., specifications for DRAM*, 1–14, 1–16, (1995).
Comerford, R., et al., "Memory catches up", *IEEE Spectrum*, , 34–35, (Oct. 1992).
Farmwald, M., et al., "A fast path to one memory", *IEEE Spectrum*, , 50–51, (Oct. 1992).
Foss, R., et al., "Fast Interfaces for DRAMs", *IEEE Spectrum*, , 54–57, (Oct. 1992).
Gjessing, S., et al., "A RAM link for high speed", *IEEE Spectrum*, 52–53, (Oct. 1992).
Inoue, M., et al., "A 16Mb DRAM with An Open Bit–Line Architecture", *IEEE International Solid–State Circuits Conference*, pp. 246–247, (1999).
Jones, F., "A new era of fast dynamic RAMS", *IEEE Spectrum*, 43–49, (Oct. 1992).
Ng, R., "Fast computer memories", *IEEE Spectrum*, 36–39, (Oct. 1992).
Pinkham, R., et al., "A 128K x 8 70–MHz Multiport video RAM with Auto Register Reload and 8 x 4 Block WRITE Feature", *IEEE J. Solid–State Circuits*, 23, 1136–1139, (OCt. 1988).

(List continued on next page.)

Primary Examiner—Charles Bowers
Assistant Examiner—Craig Thompson
(74) Attorney, Agent, or Firm—Schwegman, Lundberg, Woessner & Kluth, P.A.

(57) ABSTRACT

A system and method for forming a memory having at least 16 megabits ($2^{24}$ bits) and only a single deposition layer of highly conductive interconnects. The resulting semiconductor die or chip fits within existing industry-standard packages with little or no speed loss over previous double metal deposition layered DRAM physical architectures. This is accomplished using a die orientation that allows for a fast single metal speed path. The architecture can be easily replicated to provide larger size memory devices. In addition, a method is described for reducing parasitic resistance in an n-sense amplifier.

12 Claims, 17 Drawing Sheets

U.S. PATENT DOCUMENTS

| | | | |
|---|---|---|---|
| 4,958,088 | 9/1990 | Farah-Bakhsh et al. | 307/443 |
| 4,989,068 | 1/1991 | Yasuhara et al. | 357/72 |
| 5,021,864 | 6/1991 | Kelly et al. | 357/70 |
| 5,042,011 | 8/1991 | Casper et al. | 365/205 |
| 5,066,999 | 11/1991 | Casper | 357/51 |
| 5,084,406 | 1/1992 | Rhodes et al. | 437/52 |
| 5,150,186 | 9/1992 | Pinney et al. | 357/42 |
| 5,155,704 | 10/1992 | Walther et al. | 365/201 |
| 5,162,248 | 11/1992 | Dennison et al. | 437/52 |
| 5,220,221 | 6/1993 | Casper | 307/530 |
| 5,270,241 | 12/1993 | Dennison et al. | 437/52 |
| 5,274,276 | 12/1993 | Casper et al. | 307/443 |
| 5,278,460 | 1/1994 | Casper | 307/296.5 |
| 5,292,677 | 3/1994 | Dennison | 437/52 |
| 5,293,342 | 3/1994 | Casper et al. | 365/203 |
| 5,295,100 | 3/1994 | Starkweather et al. | 365/189 |
| 5,303,180 | 4/1994 | McAdams | 365/63 |
| 5,311,481 | 5/1994 | Casper et al. | 365/230.06 |
| 5,338,700 | 8/1994 | Dennison et al. | 437/60 |
| 5,340,763 | 8/1994 | Dennison | 437/52 |
| 5,340,765 | 8/1994 | Dennison et al. | 437/52 |
| 5,347,179 | 9/1994 | Casper et al. | 307/451 |
| 5,352,945 | 10/1994 | Casper et al. | 307/603 |
| 5,357,172 | 10/1994 | Lee et al. | 315/167 |
| 5,361,002 | 11/1994 | Casper | 237/530 |
| 5,362,666 | 11/1994 | Dennison | 437/52 |
| 5,367,213 | 11/1994 | Casper | 327/56 |
| 5,369,317 | 11/1994 | Casper et al. | 326/87 |
| 5,394,172 | 2/1995 | McLaury | 345/200 |
| 5,445,707 | 8/1995 | Toyama et al. | 216/22 |
| 5,446,410 | 8/1995 | Nakakura | 327/565 |
| 5,527,663 | 6/1996 | Togawa et al. | 430/320 |
| 5,733,807 * | 3/1998 | Shiozawa | 438/238 |
| 5,748,552 | 5/1998 | Fung et al. | 365/230.03 |
| 5,815,456 | 9/1998 | Rao | 365/230.03 |
| 5,835,932 | 11/1998 | Rao | 711/5 |
| 5,838,627 | 11/1998 | Tomishima et al. | 365/230.03 |

OTHER PUBLICATIONS

Pickham, R., et al., "A 128K x 8 70HMz Video Ram with Auto Register Reload", *IEEE International Solid–State Circuits Conf.*, 233–237, (Feb. 19, 1988).

Salters, R.H. "Fast DRAMS for sharper TV", *IEEE Spectrum*, 40–42, (Oct. 1992).

Yamada, K., et al., "A CPU Chip–On–Board Module", *Proc.: IEEE 43rd Electronic Compoments & Technology Conf.*, Orlando, FL, pp. 8–11, (Jun. 1–4, 1993).

* cited by examiner

| | | | |
|---|---|---|---|
| Vcc | 1 | 42 | DQ16 |
| DQ1 | 2 | 41 | DQ15 |
| DQ2 | 3 | 40 | DQ14 |
| DQ3 | 4 | 39 | DQ13 |
| DQ4 | 5 | 38 | Vss |
| Vss | 6 | 37 | DQ12 |
| DQ5 | 7 | 36 | DQ11 |
| DQ6 | 8 | 35 | DQ10 |
| DQ7 | 9 | 34 | DQ9 |
| DQ8 | 10 | 33 | Vcc |
| Vcc | 11 | 32 | Vss |
| Vss | 12 | 31 | Vcc |
| CASL | 13 | 30 | CASH |
| WE | 14 | 29 | OE |
| RAS | 15 | 28 | A10 |
| A0 | 16 | 27 | A9 |
| A1 | 17 | 26 | A8 |
| A2 | 18 | 25 | A7 |
| A3 | 19 | 24 | A6 |
| A4 | 20 | 23 | A5 |
| Vcc | 21 | 22 | Vss |

FIG. 17

METHOD OF MANUFACTURING A SINGLE DEPOSITION LAYER METAL DYNAMIC RANDOM ACCESS MEMORY

This application is a division of U.S. Ser. No. 08/871,362 filed Jun. 9, 1998 now U.S. Pat. No. 5,903,481 which is incorporated herein by reference.

FIELD OF THE INVENTION

The present invention pertains generally to integrated circuit memory design, and in particular to dynamic random access memory design.

BACKGROUND OF THE INVENTION

Dynamic Random Access Memory (DRAM) devices are the most widely used type of memory device. The amount of singlebit addressable memory locations within each DRAM is increasing as the need for greater memory part densities increases. This demand for greater memory densities has created a global market and has resulted in memory part standards in which many memory parts are regarded as fungible items. Thus, many memory parts operate according to well known and universally adopted specifications such that one manufacturers memory part is plug-compatible with another manufacturer's memory part.

There is a need in the art to produce memory parts which can fit within the packaging requirements of previous generations of memory parts. This need for "plug-compatible upgrades" requires that memory density upgrades are easy to effect in existing computer systems and other systems which use memory, such as video systems. This requires that greater density memory parts be placed within the same size packages as previous generations of memory parts with the same signal and power pinout assignments.

There is a further need in the art to more efficiently manufacture CMOS dynamic random access semiconductor memory parts which utilize space-saving techniques to fit the most memory cells within a fixed die size using a single deposition layer of highly conductive interconnect. There is a need in the art to manufacture such memory parts in a shorter production time using fewer process steps to produce more competitively priced memory parts.

SUMMARY OF THE INVENTION

The present invention solves the above-mentioned needs in the art and other needs which will be understood by those skilled in the art upon reading and understanding the present specification. The present invention includes a memory having at least 16 megabits ($2^{24}$ bits) which is uniquely formed in which highly conductive interconnects (such as metal) are deposited in a single deposition step. The invention is described in reference to exemplary embodiments of 16 and 32 Megabit Dynamic Random Access Memory in which only a single deposition layer of highly conductive interconnects are deposited in a single deposition step. The resulting semiconductor die or chip fits within existing industry-standard packages with little or no speed loss over previous double metal deposition layered DRAM physical architectures. This is accomplished using a die orientation that allows for a fast single metal speed path. The use of a single deposition layer metal design results in lower production costs, and shorter production time for a wide variety of memory parts, including but not limited to, DRAM, SDRAM, SRAM, VRAM, SAM, and the like. In addition, the architecture can be easily replicated to provide larger size memory devices.

According to one aspect of the present invention, a method of reducing parasitic resistance in an n-sense amplifier is described in which a ground bus is connected through row decoder logic to the n-sense amplifier.

BRIEF DESCRIPTION OF THE DRAWINGS

In the drawings, where like numerals refer to like components throughout the several views:

FIG. 17 is a detailed diagram showing a preferred pinout for the 32 megabit single deposition layer metal DRAM die of FIG. 15.

DETAILED DESCRIPTION OF THE INVENTION

Figure 1:
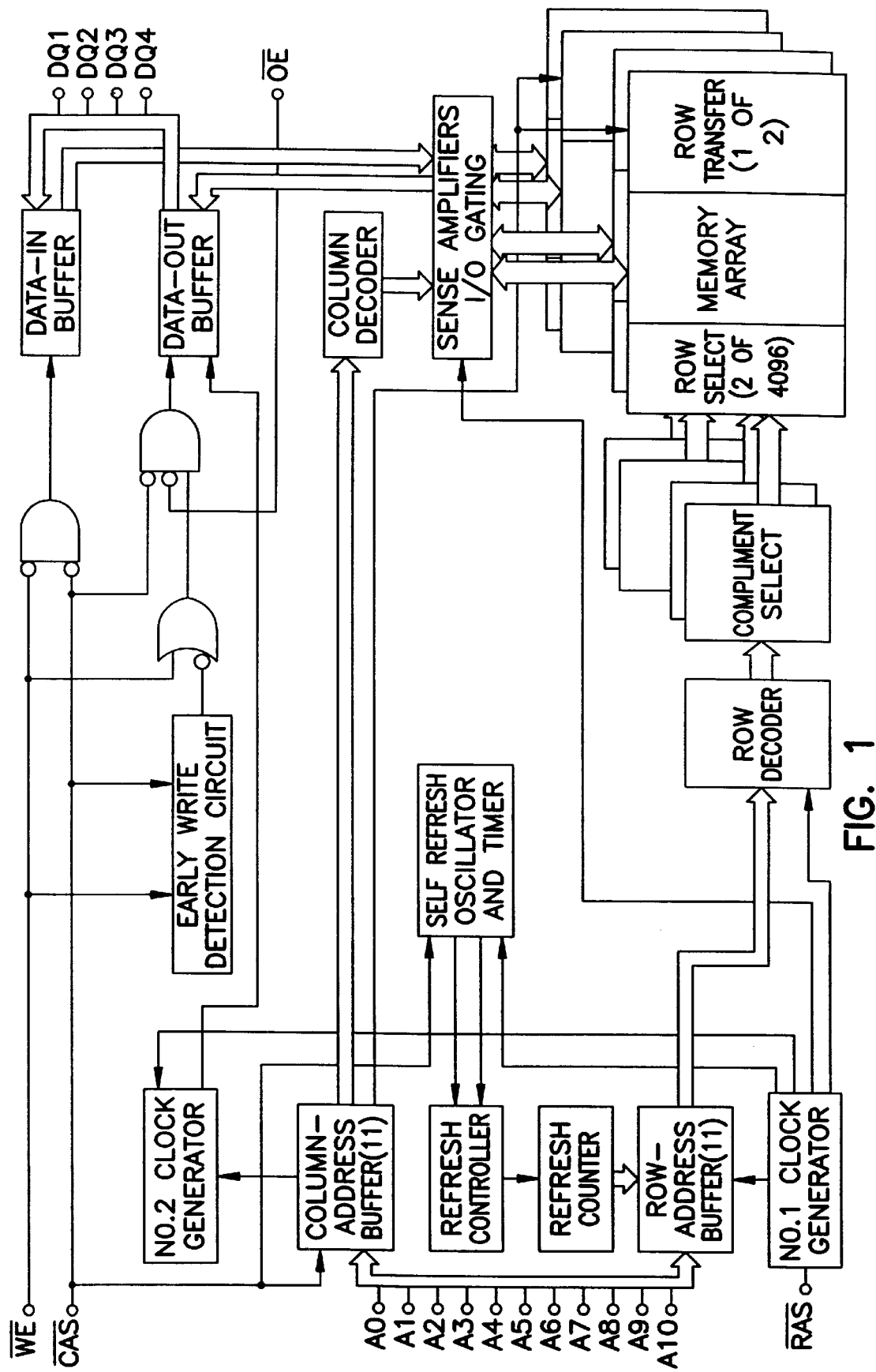
FIG. 1 is a functional block diagram of one configuration of a 16 megabit single deposition layer metal DRAM.

In the following detailed description of the preferred embodiment, references made to the accompanying drawings which form a part hereof, and in which is shown by way of illustration specific preferred embodiments in which the invention may be practiced. These embodiments are described in sufficient detail to enable those skilled in the art to practice the invention, and it is to be understood that other embodiments may be utilized and that structural, logical, physical, architectural, and electrical changes may be made without departing from the spirit and scope of the present invention. The following detailed description is, therefore, not to be taken in a limiting sense, and the scope of the present invention is defined only by the appended claims and their equivalents.

Design Overview

The present invention is directed to a novel design for a memory device in which a plurality of highly conductive interconnects (such as metal) are deposited in a only single deposition step. The present invention is described in two exemplary embodiments as CMOS Dynamic Random Access Memory (DRAM) memory parts having at least a 16 million ($2^{24}$) and 32 million ($2^{25}$) bit storage capacity, respectively, fabricated using a single deposition layer metal and having an overall die size manufactured specifically to fit in an industry standard integrated circuit package. This memory part includes an improved row decoder/driver design, a new layout for the sense amplifier, and a new array orientation which permits the placement of address and data pads at the ends of the die and the use of a single deposition layer of highly conductive interconnect to enable greater density and global routing.

For the purposes of this disclosure, references to "highly conductive interconnects" shall refer to any interconnect materials having a sheet resistance of less than one ohm per square and includes metal interconnect materials. References to a "single deposition layer metal" shall refer to a mask-defined, highly conductive interconnect layer which is deposited in a single deposition step. Deposition techniques are methods known to those skilled in the semiconductor arts. Some examples of highly conductive interconnects include, but are not limited to, aluminum, tungsten, titanium, titanium nitride, and titanium tungsten.

Additionally, a "semiconductive interconnect" is any interconnect comprising a material having greater than 1 ohm per square sheet resistivity. Some examples of semiconductive interconnect materials and their sheet resistance are presented in TABLE 1, below. Those skilled in the art will readily recognize that other highly conductive interconnect and semiconductive interconnect materials could be utilized without departing from the scope and spirit of the present invention. The above examples are offered for illustration and are not intended to be exclusive or limiting.

TABLE 1

SEMICONDUCTIVE INTERCONNECT MATERIALS

| MATERIAL | SHEET RESISTANCE (ohms/square) |
|---|---|
| n+ diffusion | 75 |
| p+ diffusion | 75 |
| n− diffusion | 4000 |
| unstrapped polysilicon | 200 |
| tungsten silicide strapped polysilicon | 6 |

FIG. 1 is a functional block diagram of a typical memory configuration for the single deposition layer metal 16 Mb DRAM in a 4 Mb by 4 bit configuration. The present invention can be configured to operate according to this functional block diagram. Those skilled in the art will readily recognize that different functional configurations may be implemented using the physical architecture and the single deposition layer metal technology of the present invention. The 4 Mb by 4 bit configuration of FIG. 1 is illustrative only and the present invention is not so limited. The implementation of memory parts using the present invention allows the production of a 16 megabit single deposition layer metal DRAM which operates identically to and is plug compatible with the other 16 megabit DRAMs available in 300 ml wide SOJ and TSOP package outlines but which can, at the same time, be produced more economically.

Figure 3:
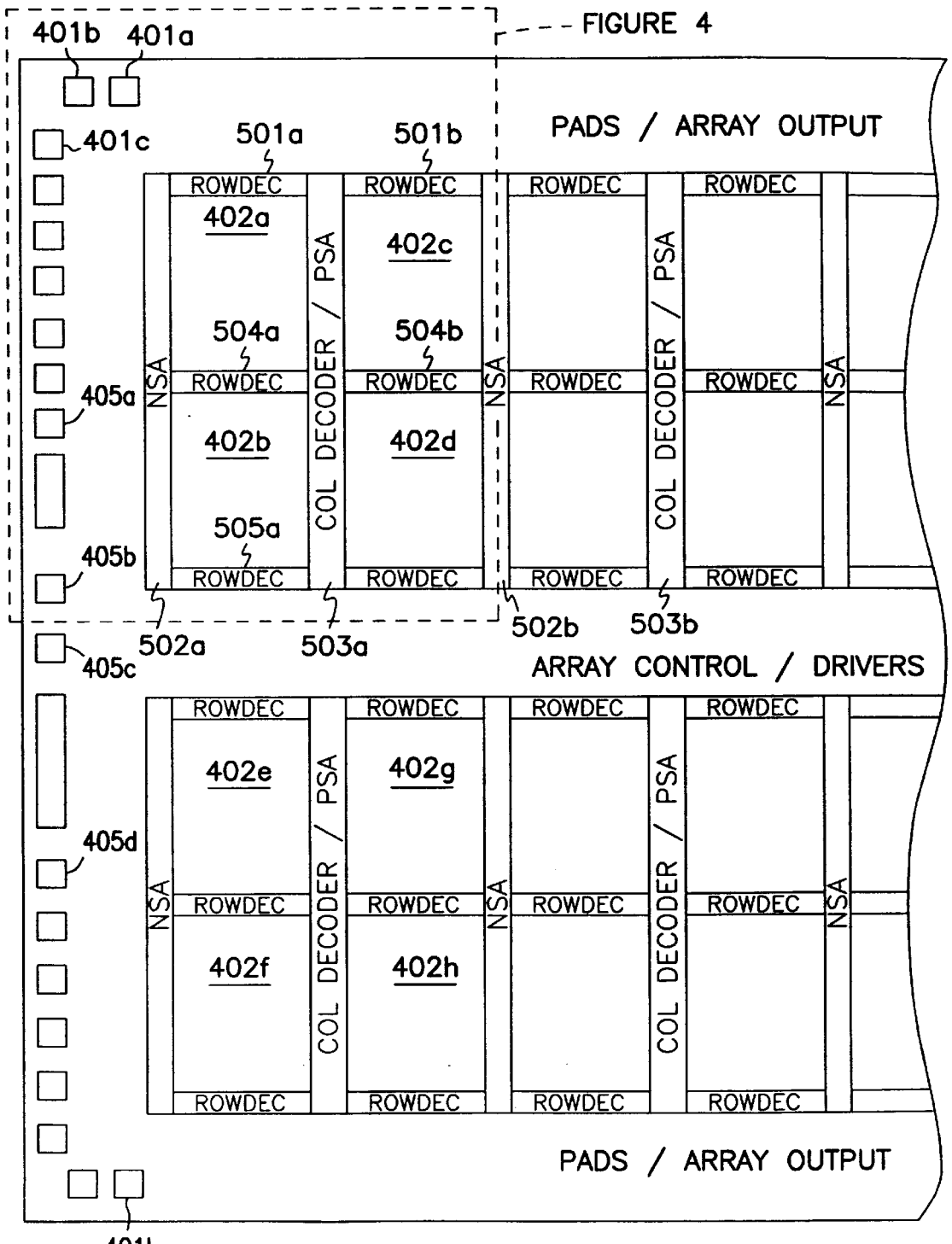
FIG. 3 is a detailed portion of the physical layout view of the 16 megabit single deposition layer metal DRAM of FIG. 2.

The memory shown in the functional block diagram of FIG. 1 operates according to well known principles. The eleven address lines shown to the left of FIG. 1 are clocked into the ROW ADDRESS BUFFFER by the signal RAS (row address strobe) to select the row in the memory array to be read or written. At a later time, the same eleven address lines are clocked into the COLUMN ADDRESS BUFFER by the signal CAS (column address strobe) to select the column in the memory array to be read or written. The data lines shown on the right of FIG. 3 are bidirectional data ports used for both reading and writing data Not shown in FIG. 1 (since it is usually transparent to the end user) is the circuitry for controlling the spare memory cell areas and the fuses used to substituted good memory cell areas for areas found to be defective after manufacture. This circuitry is used only for the repair of memory chips after manufacture but before delivery to the customer.

16 Megabit Single Deposition Layer Metal DRAM Architecture

Figure 2:
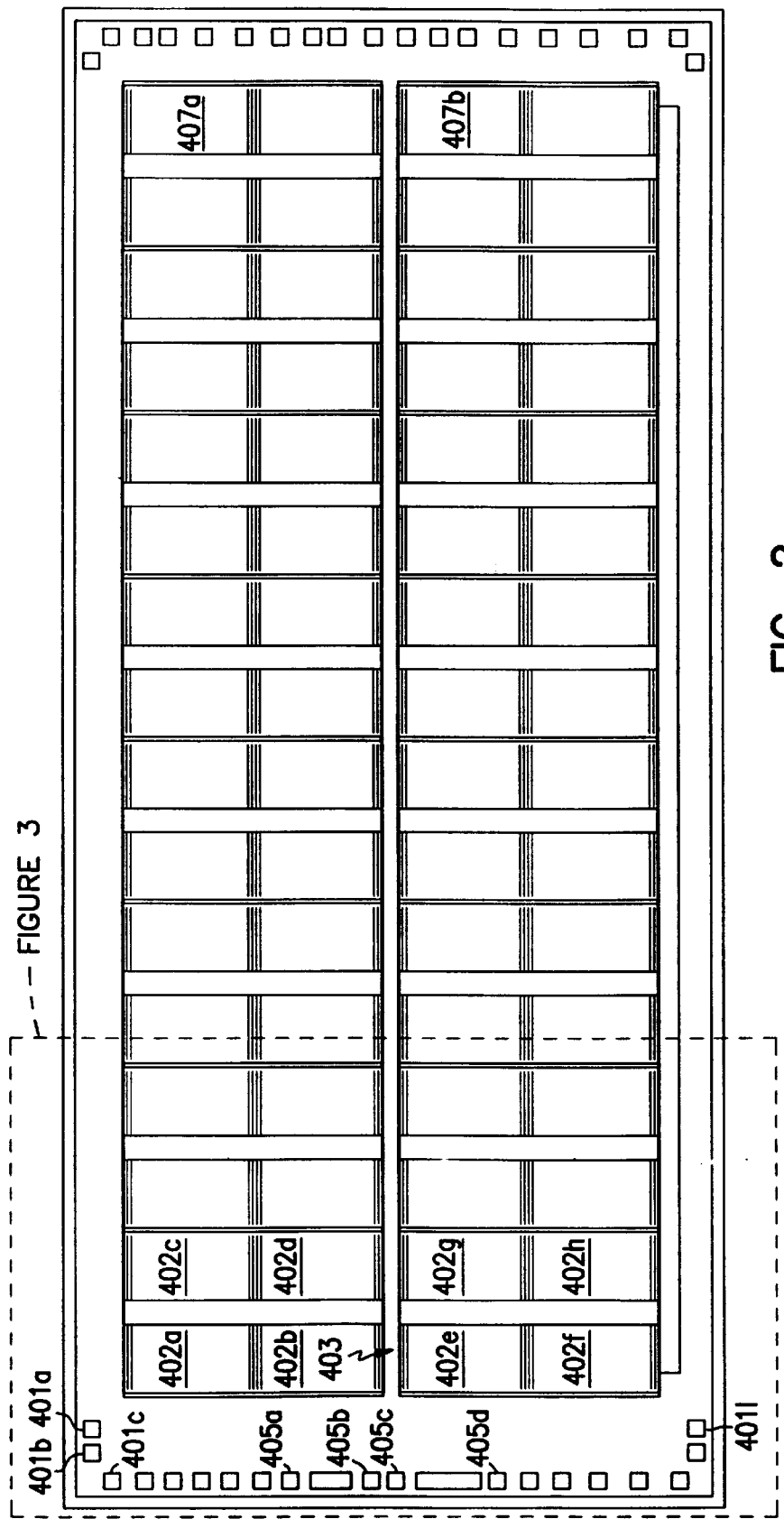
FIG. 2 is a physical layout view of the surface of a 16 megabit single deposition layer metal DRAM.

The physical architecture of the present invention is shown in block diagram form in FIG. 2. Semiconductor memory device 400 includes signal bonding pads 401 and power bonding pads 405 clustered toward the ends of semiconductor die 400. Representative pads 401 and 405 are labeled as 401*a* through 401*l* and 405*a* through 405*d*, respectively. By clustering pads 401 and 405 at the ends of device 400, the cost in area is reduced from the width of the pad times the length of the chip to the width of the pad times the width of the chip. This can add up to significant area (and therefore cost) savings in the typical device 400.

The 16 Mb DRAM physical architecture shown in FIG. 2 has the memory cells and active support circuitry divided into two memory sections (407*a* and 407*b*), with I/O path area 403 between sections 407*a* and 407*b*. Each section 407 contains 8 Mb of memory cell area with each section divided into 32 subarrays 402 of 256 kilobits ($2^{18}$ bits) of single bit memory cells (where 1 Kb=1024 bits). Each 256 Kb cell subarray 402 is serviced by row decoders, column decoders, and sense amplifiers which are collectively referred to as pitch cells. Pitch cells are the circuits linearly aligned with the memory cells in an array along row and column lines. The pitch cells are so called because the cells are said to be on the same pitch as the line of memory cells serviced by the pitch cells. The layout of these pitch cells is described below in more detail.

Since only a single deposition layer metal is used in the present implementation of memory device 400, the operational speed of memory subarrays 402 is of paramount importance. In one embodiment, signal lines are all highly conductive interconnect lines to provide rapid distribution of the data into or out of the memory arrays. In another embodiment, the digit or bit lines in the memory cell arrays are implemented in highly conductive interconnect material and the word or row lines are implemented in semiconductive material. In yet another embodiment, the word lines in the memory cell arrays are implemented in a highly conductive interconnect material and the bit lines are implemented in semiconductive material. Those skilled in the art will readily recognize that a wide variety of highly conductive materials may be used in the implementation of the present invention such as metals including titanium, aluminum, tungsten, titanium nitride, titanium tungsten, etc. deposited using vapor deposition or other known techniques. The aforementioned list of selected metal types is illustrative only and not intended to be limiting.

Since the use of the highly conductive interconnect is limited to one deposition step, more of the pitch cell interconnect is implemented in diffusion layers and polysilicon. This is necessarily a slower signal path than metal due to the increased resistance and capacitance of such an interconnect. To minimize the need for long run lengths of interconnect, the memory cell areas are subdivided into small regions. With more subdivisions of cell area, more pitch cells are required to service those cell areas. But within the global restriction of a die size remaining approximately the same size as prior art multiple metal layer DRAM parts, the size of the cell areas in the present invention is reduced and the pitch cells are closely spaced and staggered to conserve space.

Referring to FIG. 3, an expanded view of a portion of memory sections 407a and 407b of FIG. 2 is shown. FIG. 3 shows memory subarrays 402a, 402b, 402c, 402d, etc. from section 407a of semiconductor die 400 of FIG. 2 and memory subarrays 402e, 402f, 402g, 402h, etc., from section 407b of FIG. 2. The novel architecture shown in FIGS. 2 and 3 is specifically designed to minimize read and write times between the input and output (I/O) pins for accessing the memory cells in the array. Although a long lead length may be required between an input bonding pad and an actal cell being addressed,the data line to the output bonding pad would be quite short. In a complementary fashion, a memory cell which has a short physical connection to the input address bonding pads may have a long data path to the output data line. In this fashion, the overall access time of any one cell in the array is averaged to be 70 nanoseconds or less.

In one embodiment, memory subarrays 402 are arranged as an array of 512 bits by 512 bits. Subarrays 402 are serviced by n-sense amplifiers (NSA) 502 and combined column decoder/p-sense amplifier (PSA) circuits 503 shown in the vertical rectangles in FIG. 3. The column address decoders (COL DECODER) for the memory subarrays are collocated with the p-sense amplifiers in combined column decoder/p-sense amplifier (PSA) circuit 503.

Figure 5:
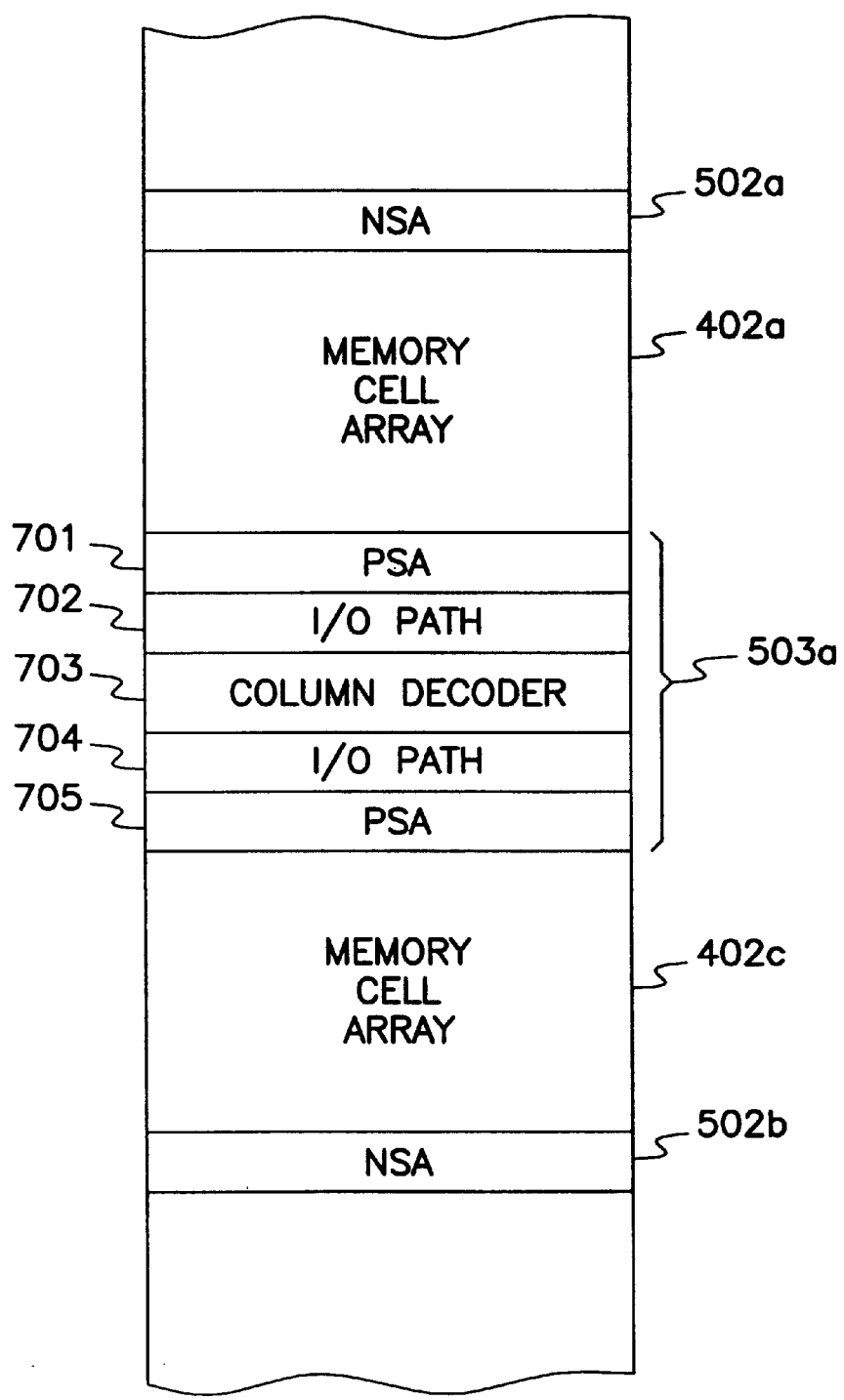
FIG. 5 is a detailed cross section of the physical layout view of the 16 megabit single deposition layer metal DRAM die of FIG. 3, showing placement of the memory cell arrays, I/O paths, p-sense amplifiers, n-sense amplifiers and column decoder circuitry.

(The placement of the column address decoders and the p-sense amplifiers is shown in further detail in FIG. 5 in which, due to the orientation of FIG. 5, n-sense amplifier (NSA) 502a, memory subarray 402a, combined column decoder/p-sense amplifier (PSA) circuit 503a, memory subarray 402c and n-sense amplifier 502b are shown in a horizontal stack. FIG. 5 shows in more detail the makeup of area 503 where p-sense amplifier 701 and I/O path 702 service memory cell array 402a while I/O path 704 and PSA 705 service memory subarray 402c. Column decoder 703 services both memory cell array 402a and 402c. The specific layout of these areas is described more fully below.)

Referring once again to FIG. 3, the row address decoders (ROWDEC) are located in the horizontal arms 501a, 504a, 505a, etc. between memory subarrays 402. For the memory subarrays 402 shown in FIG. 3, the array control and output data flow toward the upper portion of die 400 and for the subarray in the lower half of FIG. 3, the array control and output data flow toward the lower portion of the die.

Figure 4:
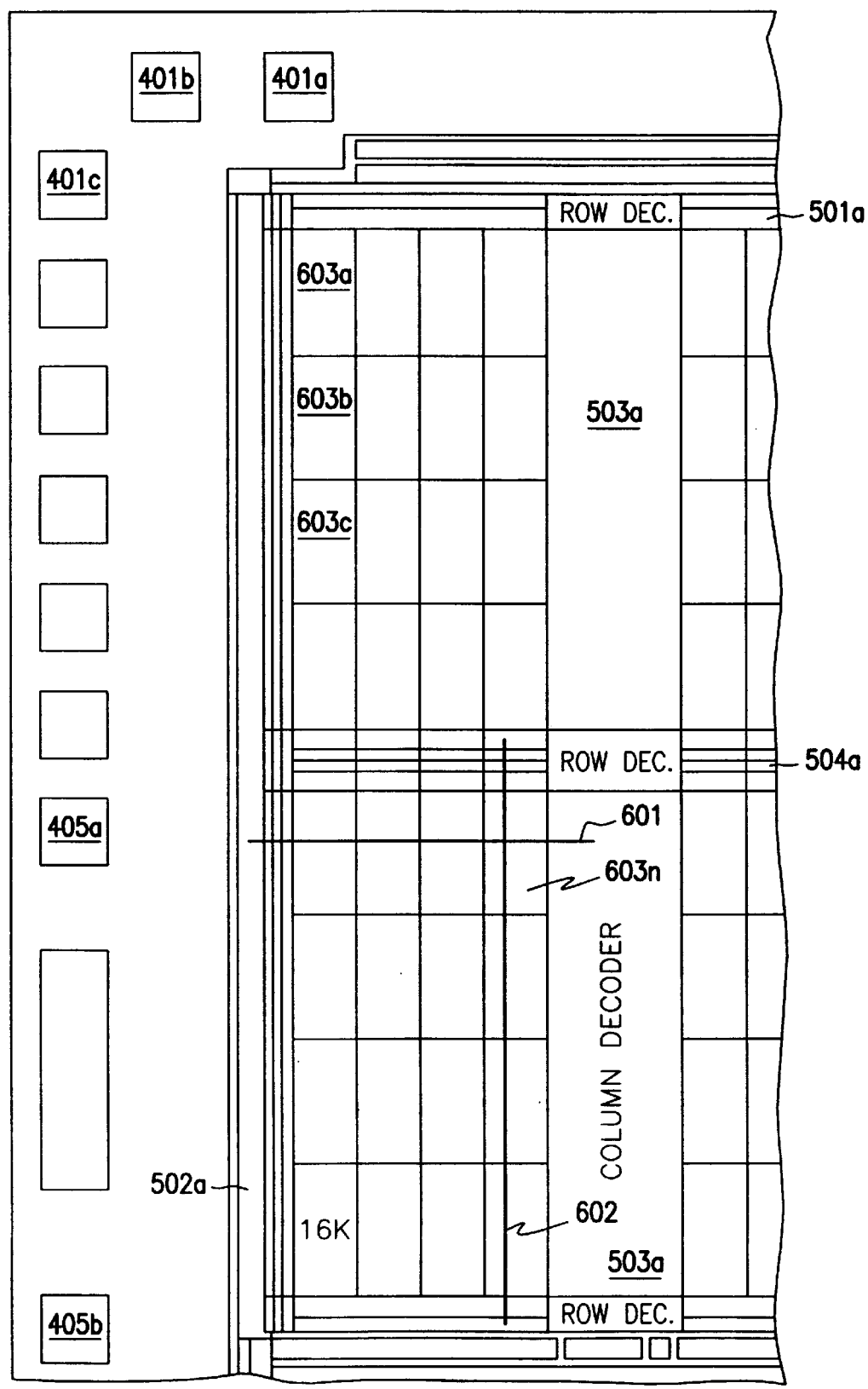
FIG. 4 is an even more detailed portion of the physical layout view of the 16 megabit single deposition layer metal DRAM of FIG. 3.

FIG. 4 shows memory subarrays 402 further divided into 16K memory blocks 603 (603a, 603b, 603c, etc.) of memory cell areas arranged as 128 bits by 128 bits. In one embodiment, the bit or digit lines 601 across the memory cell blocks are implemented in highly conductive interconnect material (such as metal) and connect the memory cell areas 603n to the column decoders. In this embodiment, the word lines 602 across the memory cell blocks 603n are polysilicon connecting the memory cells to the row decoders. The data paths to and from the cell areas are connected to the peripheral signal bonding pads by routing the data paths in areas 503a toward the die periphery located toward the top left of FIG. 4. Those skilled in the art will readily recognize that the word lines 602 across the memory cell blocks may also be implemented using conductively strapped polysilicon to connect the memory cells to the row decoders.

In an alternate embodiment, the digit lines 601 are implemented in polysilicon or conductively strapped polysilicon. In this alternate embodiment, the word lines 602 across memory cell blocks 603 are implemented in highly conductive interconnect material to connect the memory cells to the row decoders.

As described above, row drivers, row decoders, column decoders, and sense amplifiers are collectively referred to as pitch cells. The pitch cells are so called because the cells are said to be on the same pitch as the line of memory cells serviced by the pitch cells. Since the pitch cell areas of the DRAM of the present invention make up roughly 15% of the die area, the pitch cells are kept as small and narrow as possible. The memory cells are very small in relation to the pitch cell size so the pitch cells are staggered and closely spaced to allow the pitch cells to stay on pitch. Since the row decoders drive the word lines with a slightly elevated voltage to write the memory cells with a slightly higher voltage to ensure maximum capacitor charge voltage, the transistors of the row decoders must be fortified to prevent overvoltage punch-though. Field implant, which is typically used only for isolation, is used in the transistors of the row decoders to improve the resistance to punch-though. Also, to properly isolate the transistors in the row decoders from their neighbors, grounded gate isolation over field oxidation is used, as described below in conjunction with FIGS. 10 and 11 below.

Power Distribution

Figure 6:
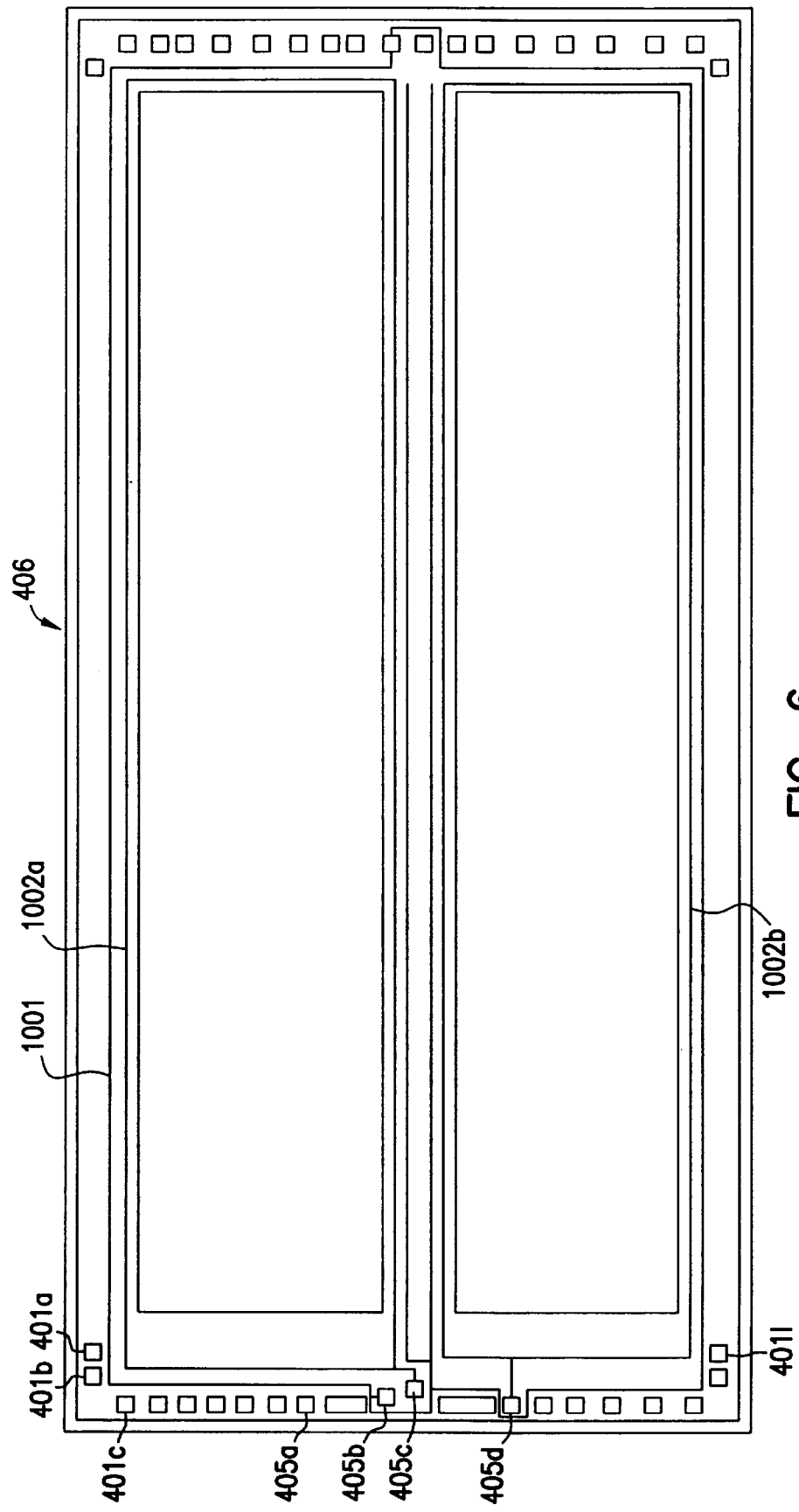
FIG. 6 is a top down view of the surface of the 16 megabit single deposition layer metal DRAM of FIG. 2 showing routing of power and ground.

The $V_{cc}$ (power) and $V_{ss}$ (ground) connections to the circuitry of memory device 400 require metal connections from the bonding pads to the circuits. The restriction of using a single deposition layer metal of interconnect and the restriction in the die size require that an efficient mechanism be used for power distribution. To assure this power is brought to the interior of the die by on-chip metal interconnects connecting the peripheral power bonding pads to the on-chip power buses for distribution. As can be seen in FIG. 6, power and ground is distributed via a power bus 1001 and a pair of ground busses 1002a and 1002b. This allows the $V_{CC}$ and $V_{ss}$ to be distributed within interior regions of device 400 without the need for on-chip power buses to go over or under one another.

FIG. 6 shows the on-chip power bussing architecture. Power and ground distribution generally requires substantially larger traces than signal interconnects. The power bonding pads shown in FIG. 6 correspond to the power bonding pads shown and described in conjunction with FIG. 2.

Single Deposition Layer Metal and Semiconductive Interconnects

In general, the preferred embodiment to the present invention is implemented using a submicron process in a dense packing architecture using a single deposition layer metal. Interconnects to the pitch cells are shared between the single deposition layer metal and semiconductive interconnects. Those skilled in the art will readily recognize that several semiconductive interconnects could be incorporated into the design. For example, in one embodiment, conductivity of semiconductive interconnects is improved by strapping the polysilicon with a refractory metal (such as tungsten or titanium) using a vapor deposition process and annealing the metal to the polysilicon. This is done as a separate step to the highly conductive interconnect deposition. Additionally, a Salicide (self-aligned silicide) process may be used to selectively place a silicide on specific active areas.

In order to obtain interconnect efficiency the n-sense amplifiers, p-sense amplifiers, and row decoders and drivers are placed on pitch with the memory cell array. On-pitch interconnects are a much more efficient usage of the single deposition layer metal than off pitch interconnects, since on-pitch interconnects are less likely to overlap and require semiconductive interconnects to complete a circuit. The pitch cells are necessarily larger in width than the memory cells so the pitch cells are staggered to enable the wider pitch cells to stay on pitch with the memory cells. The pitch cells are constructed to be narrow which, in the case of a row driver pitch cell, requires that the row driver transistors be especially immune to failure due to the increase voltage they are required to source. A novel row driver design is described below which provides staggered on-pitch layout using isolation circuits to eliminate punch through and channel leakage current effects.

The preferred embodiment to the present invention incorporates n-sense and p-sense amplifiers for reading cells and refreshing cells. Referring once again to FIG. 5, the block diagram shows a detailed enlargement of the column decoder/PSA 503 of FIG. 3. In one embodiment of the present design, n-sense amplifiers 502a, 502b are shared between adjacent memory cell arrays 402a and 402c, and dual p-sense amplifiers 701 and 705 service memory cell arrays 402a and 402c, respectively. In this embodiment, column decoder 703 is situated between I/O paths 702 and 704. I/O paths 702 and 704 are the pathways for data to the data pins after proper row and column selection performing row access strobe (RAS) and column access strobe (CAS) commands to access a particular word of the memory.

Figure 7:
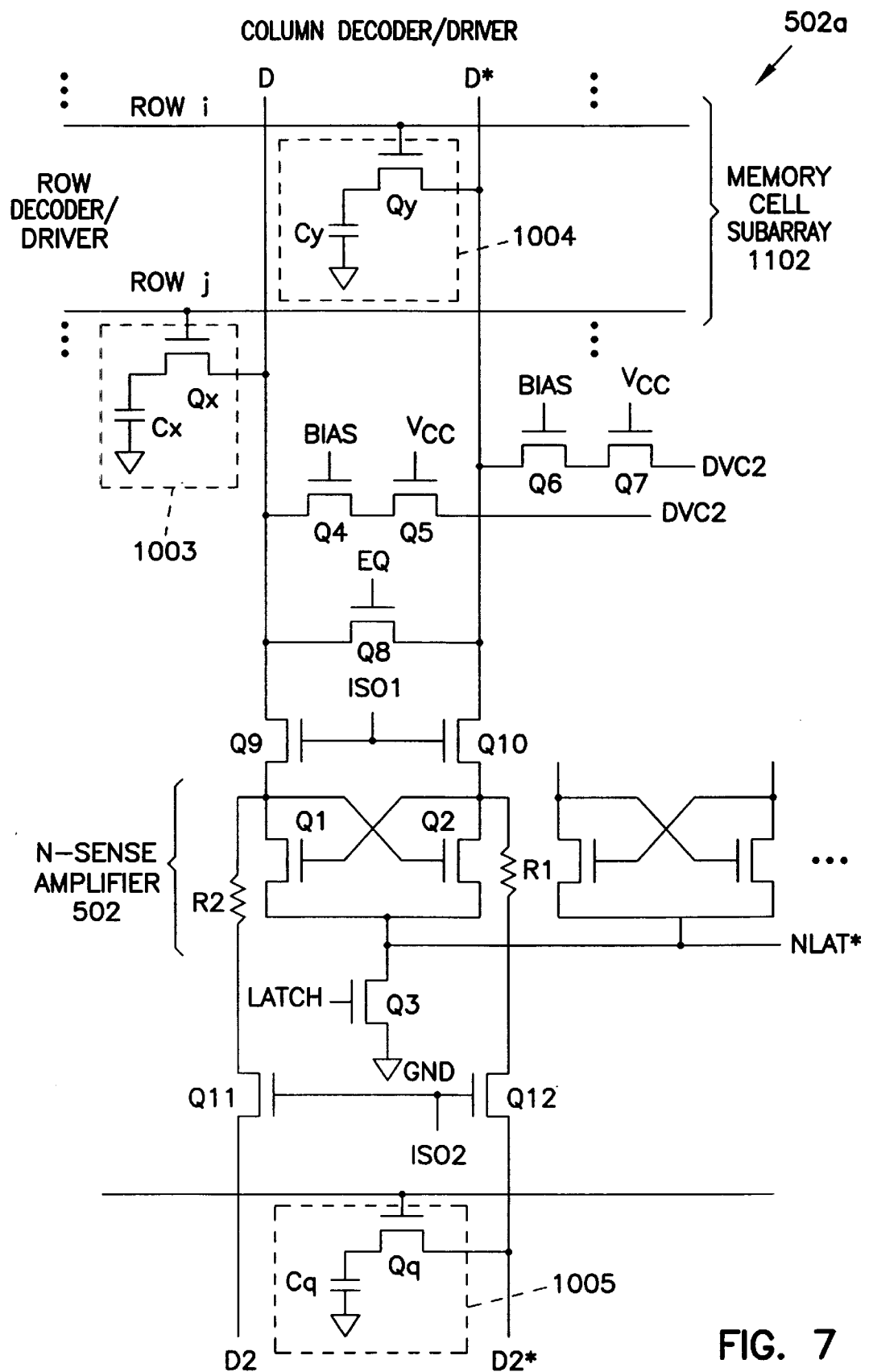
FIG. 7 is an electrical schematic diagram of the n-sense amplifiers, including precharge, equalization, and isolation circuitry in one embodiment of the 16 megabit single deposition layer metal DRAM of FIG. 2.

FIG. 7 shows a schematic diagram of one embodiment of an n-sense amplifier and related circuitry. In this configuration, a memory cell subarray 1102 is connected to an array of n-sense amplifiers for both reading the state of the memory cells and refreshing each cell as it is read. The n-sense amplifier comprises two cross coupled nChannel enhancement mode field effect transistors Q1 and Q2, a latch transistor Q3, and bias network transistors Q4, Q5, Q6, and Q7. Cross coupled n-channel enhancement mode field effect transistors Q1 and Q2 are connected through latch transistor Q3 to a ground GND. FIG. 7 also shows two parasitic resistances R1 and R2 formed during fabrication. R1 and R2 usually have resistances which differ by an order of magnitude. These resistances can, therefore, create an inherent imbalance in n-sense amplifier 502 which will cause it to flip the wrong direction under certain patterns in subarray 402.

Digit lines D and D* are adjacent digit line pairs which are connected to cell 1003 and 1004, respectively. The row decoding and column decoding hardware is designed such that any single memory access activates either D or D*, but never both at the same time. For example, there is no memory access which would read or refresh both cell 1003 and cell 1004 at the same time since the present architecture is a folded bit line system. This allows the active use of only one digit line of the pair per access and allows the other digit line of the pair to be used as a voltage reference for the sense amplifiers during cell read. This configuration allows an efficient use of the die area.

The operation of n-sense amplifier 502 is best described by way of an example. Referring to FIG. 7, assume an access of cell 1003 was desired to read and refresh the contents of cell 1003 (the refresh is needed due to the destructive nature of the read). Before transistor Qx is activated, n-sense amplifier 502 will precharge lines D and D* to intermediate voltage DVC2 (midpoint between $V_{cc}$ and $V_{ss}$) via transistors Q4, Q5, Q6, and Q7. Transistors Q4 and Q6 are switching transistors to connect the reference voltage to D and D*. Transistors Q5 and Q7 are long channel transistors which are used as current limiters in the event that a defective cell attempts to ground the DVC2 source. Q5 and Q7 are "on" all of the time.

Cell 1003 is connected to digit line D, therefore, after both D and D* are charged to voltage DVC2, transistor Qx will be switched on to connect capacitor Cx to D, and D* will be the reference at voltage DVC2. Since the capacitance of Cx is much less than the capacitance of D, the amount of charge on Cx will vary the voltage on D by a hundred millivolts or so. This voltage differential is sensed by cross-coupled transistor pair Q1 and Q2, which are activated when Q3 is activated (during a read operation of cell Cx). Q1 and Q2 will oparate to drive D low if Cx is a logic zero on the read, and alternatively, will drive D* low if Cx is a logic one on the read Likewise P-sense amplifier 701 (discussed in the next section) will be used to drive a digit line high if cell 1003 contains a logic one, or alternatively drive the reference digit line high if cell 1003 contains a logic zero.

Alternate embodiments of the n-sense amplifier contain an equilibrate transistor, Q8, which is switched on to equilibrate the voltages of the digit lines before a cell capacitor is connected to one of the digit lines.

The isolation circuit comprised of transistors Q9, Q10, Q11, and Q12 allows n-sense amplifier 502 to be shared between different memory cell arrays, as stated above. For example, Q9 and Q10 are switched on and Q11 and Q12 are switched off to allow n-sense amplifier 502 access to cells x and y, above. If Q9 and Q10 are switched off and Q11 and Q12 are switched on, then the n-sense amplifier is connected to another memory cell array, which includes cell 1005. The sharing of n-sense amplifiers 502 is another space-saving technique which allows the present design to fit within a confined die size.

Figure 8:
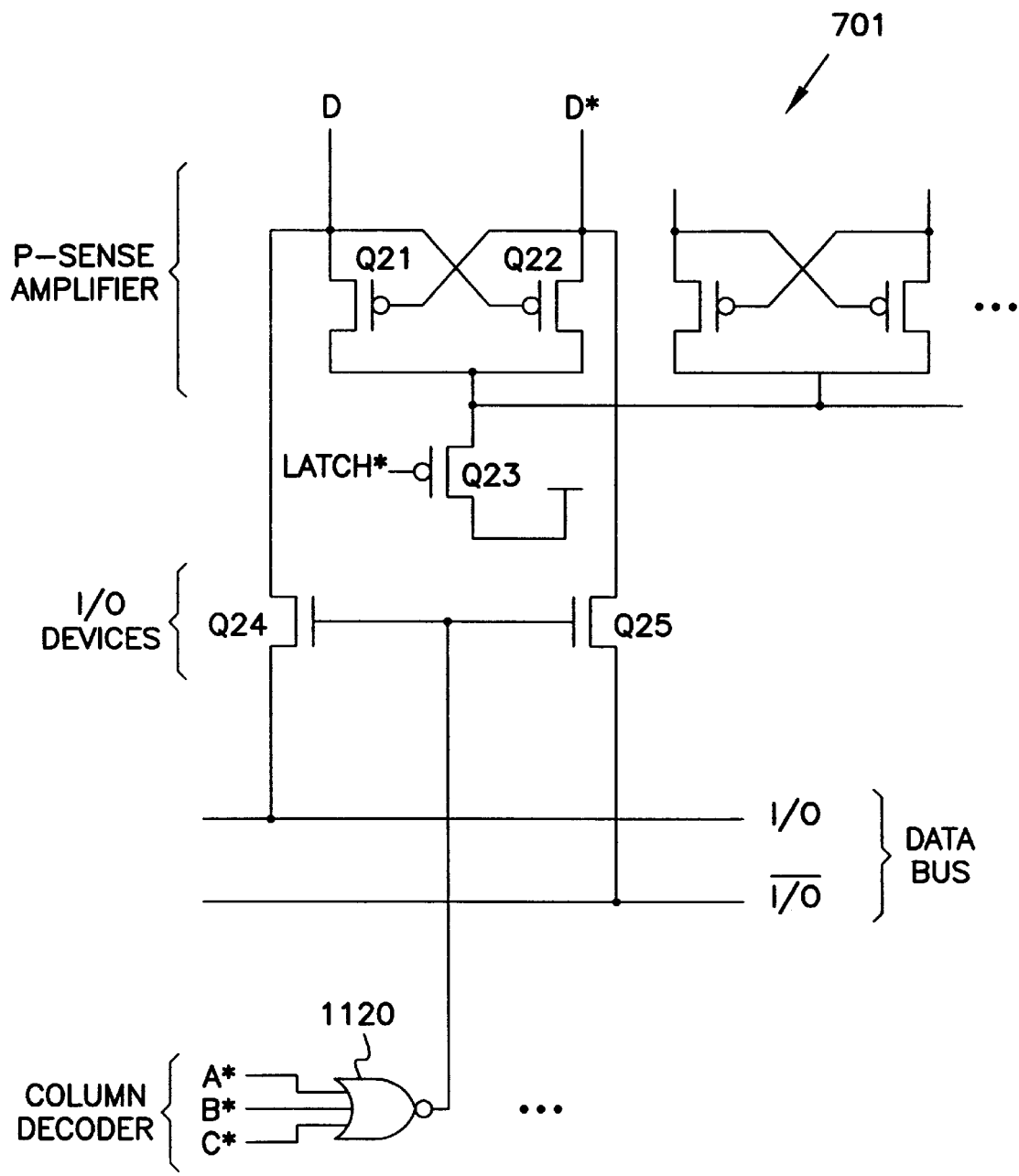
FIG. 8 is an electrical schematic diagram of the p-sense amplifiers, including input/output circuitry in one embodiment of the 16 megabit single deposition layer metal DRAM of FIG. 2.

One configuration of a p-sense amplifier 701 is shown in FIG. 8. Operation of p-sense amplifier 701 is similar to that of the n-sense amplifier 502 described above. Normally, however, Q23 is activated at close to the same time as Q3 and cross coupled transistors Q21 and Q22 operate to drive the higher digit line to logic one rather than logic zero.

The digit lines communicate with I/O device pitch cells which serve as isolation for outputs to the data bus. Column decoder logic 1120 is used to activate the appropriate I/O device to ensure one bit is driving the data bus.

Figure 9:
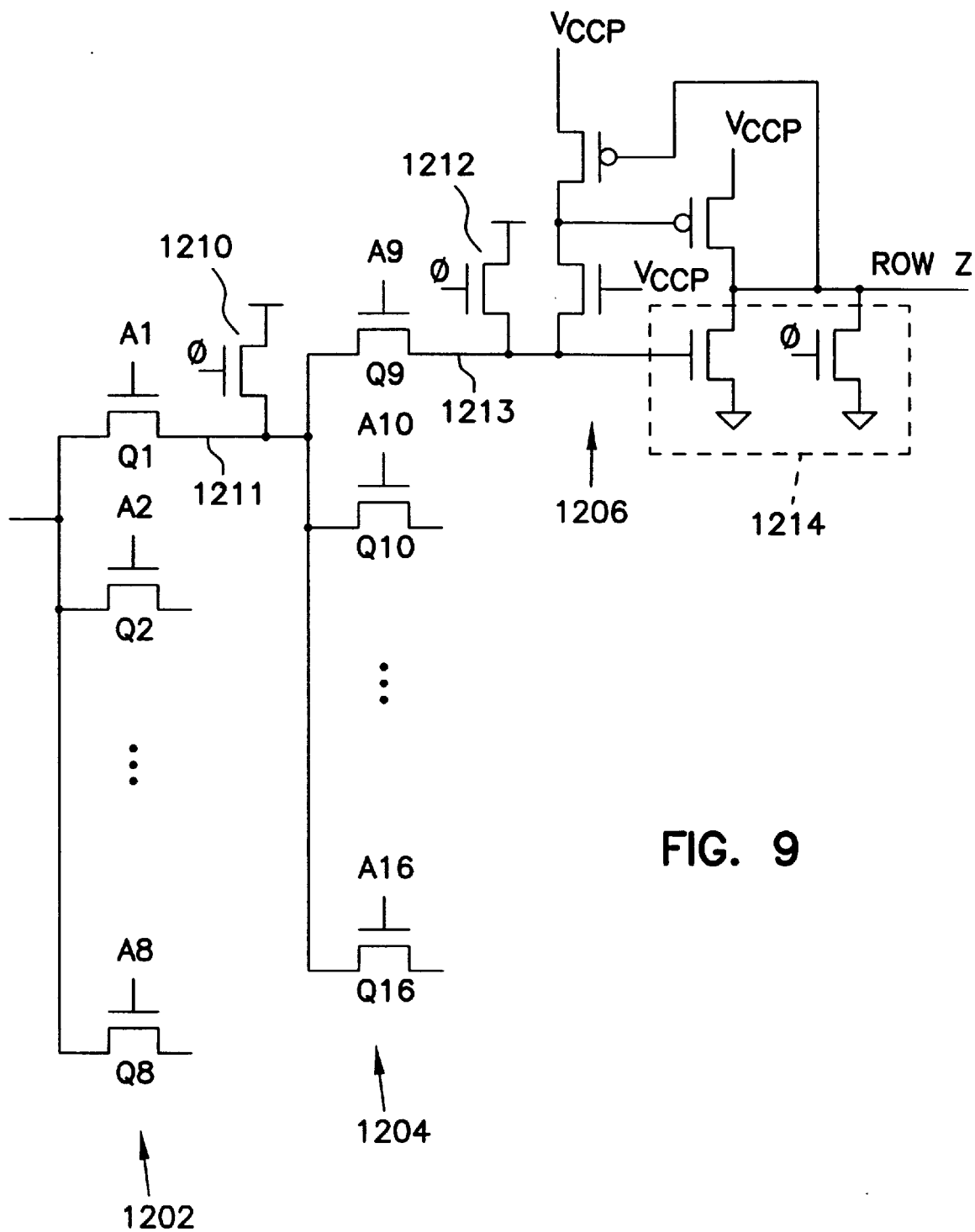
FIG. 9 is an electrical schematic diagram of the row decoder and row driver circuitry in one embodiment of the 16 megabit single deposition layer metal DRAM of FIG. 2.

One embodiment of a row decoder/driver circuit such as could be used in row decoder 501, 504 or 504 is shown in FIG. 9. Conservation of row driver circuitry is obtained by increasing the number of columns (digit lines) driven by a single row driver circuit. The voltage necessary to drive a row is boosted on the word line to allow a full-voltage "one" to be written into the cell capacitors. However, as the number of columns per row increases, row driver sizes must increase to handle the increased loads as the number of columns increase. (The voltage need not increase, but the current capacity must increase to handle the increased loads.) Thus the row driver pitch cells are designed to be protected from the effects of punch through and other voltage elevation effects.

In the present row driver circuit, transistors Q1–Q16 of FIG. 9 are enhancement mode n-channel transistors. The signal input denoted by "φ" (herein "PHI") is both a decode and clock signal which is used to synchronize row activations of the memory cell array. When PHI goes low an entire bank of row decoders is selected. To select a row, one of A1–A8 would go high and then one of A9–A16 must go high.

For example, if A1 goes high and A9 goes high, then row z is activated and goes high to activate the cell switches (FETs) per each memory cell of row z. This is accomplished by the PHI low (low active PHI) propagating through the first stage decode 1202 to second stage decode 1204 to the row driver 1206. Row driver 1206 includes an inverter circuit which inverts the PHI low to a high signal to drive the row z word line. The use of n-channel decoding transistors requires that each stage is gated per PHI individually. Transistors 1210 and 1212 separately control each stage voltage level to ensure that lines 1211 and 1213 are not floating, respectively. Bringing lines 1211 and 1213 to a high level in between PHI switching ensures that Q9 does not experience indeterminate switching due to an intermediate voltages on 1211 and 1213.

Figure 10:
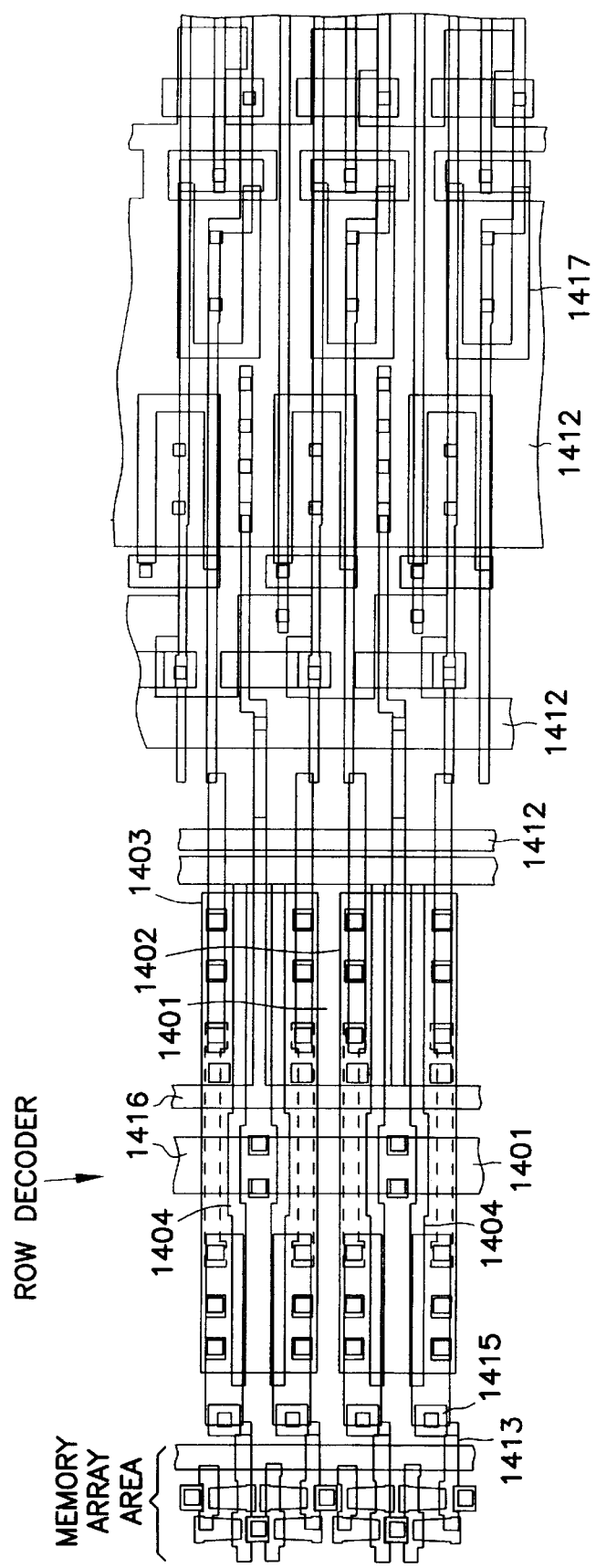
FIG. 10 is a layout diagram showing a portion of the row decoder pitch cell area and memory cell array area with the highly conductive interconnects and the semiconductor interconnects identified.

FIG. 10 is a layout diagram showing a portion of the row decoder pitch cell area and memory cell array area with the highly conductive interconnects and the semiconductor interconnects identified according to the key in Table 2 below. Field implant 1401, shown in the layout diagram of FIG. 10, serves to isolate drive transistors in area 1402 from adjacent transistors in area 1403. (The transistors in areas 1402 and 1403 correspond to the drive transistors 1214 of FIG. 9.) Implant 1404 serves to protect each transistor within area 1403 from punch through to the adjacent transistor.

TABLE 2

KEY TO LAYOUT FEATURES OF FIGS. 10–13

| MATERIAL | REFERENCE NUMBER |
|---|---|
| n+ diffusion | 1411 |
| p+ diffusion | 1412 |
| n polysilicon | 1413 |
| p polysilicon | 1414 |
| contact from diffusion or polysilicon to metal | 1415 |
| metal | 1416 |
| n-well boundary | 1417 |

Figure 11:
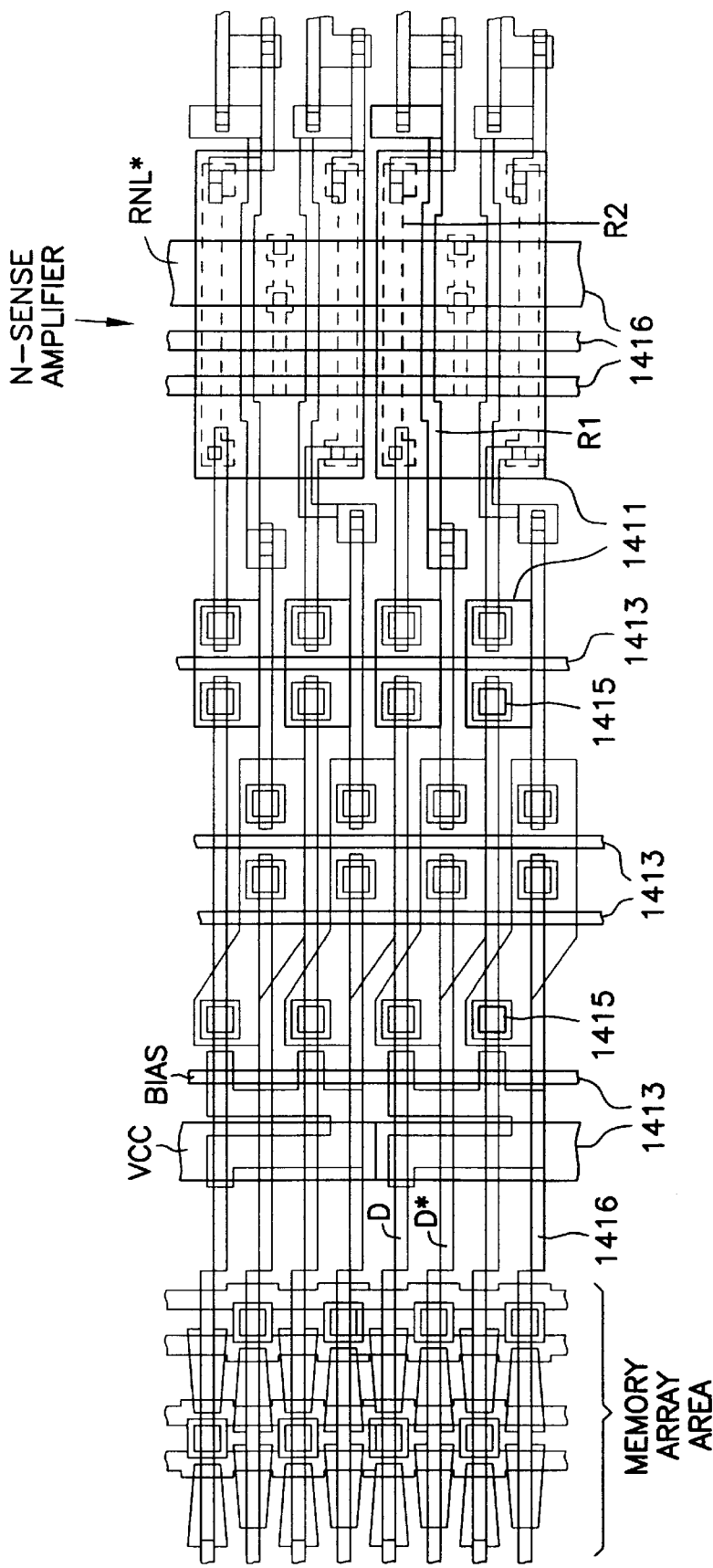
FIG. 11 is a layout diagram showing a portion of the n-sense amplifier pitch cell area and memory cell array area with the highly conductive interconnects and the semiconductor interconnects identified.

FIG. 11 is a layout diagram showing a portion of the n-sense amplifier pitch cell area and memory cell array area with the highly conductive interconnects and the semiconductor interconnects identified according to the key in Table 2 above. The memory array area is the same as that shown in FIG. 10. Metal bit lines 1416 connect the cells in the memory array to the n-sense amplifier. (These lines correspond to lines D and D* in FIG. 11.)

As noted above and as is shown in FIGS. 7 and 11, parasitic resistances R1 and R2 in n-sense amplifier 502 are formed during fabrication. Resistances R1 and R2 can differ widely in resistance, creating an inherent imbalance in n-sense amplifier 502 which will cause it to flip the wrong direction under certain patterns in subarray 402. One of the contributors to this difference in resistance is the fact that each of the digit line paths may be implemented using a combination of conductive materials. For instance, as is shown in FIG. 11, R1 may be implemented primarily in poly (with a resistance of approximately 7 ohms per square) while R2 may be a combination of poly and active diffusion area (n+ or p+ diffusion has a resistance of approximately 75 ohms per square). This problem was exacerbated in previous designs by the need to run a ground connection (GND in FIG. 7) through the n-sense amplifier area.

In one embodiment, parasitic resistance in n-sense amplifier 502 is reduced by eating an alternate path for the ground path GND in FIG. 7. Latch drivers Q3 typically are placed at the intersections of row decoders and n-sense amplifiers (i.e., where row decoders 501, 504 and 505 intersect with n-sense amplifier 502 in FIG. 3). In previous designs, as is noted above, the ground path GND for the latch drivers Q3 at the intersection of row decoder 504 and n-sense amplifier 502 was provided by simply running a ground path through n-sense amplifier 502 to latch drivers Q3. It has been found that this ground path can be eliminated and the size of n-sense amplifier 502 reduced by connecting the ground bus used in column decoder 703 through row decoder 504 and to the latch drivers Q3 at the intersection of row decoder 504 and n-sense amplifier 502. In one embodiment this is accomplished by connecting the ground bus found in column decoder 703 through row decoder 504 (via ground path 1401 shown in FIG. 10) to the latch drivers. The advantage of this approach is that it eliminates the need for running a ground bus through n-sense amplifier 502, allowing the designer to shrink the length of digit paths D and D*, and thereby reduce parasitic resistances R1 and R2. The cost is a slightly thickened ground path 1401. Therefore the width of the memory device increases by twice the increased width of ground path 1401 but decreases in length by nine times the width of the ground path removed from n-sense amplifier 502. (It should be noted that it would be a good design choice to design ground path 1401 as an all metal path to reduce the resistive drop between column decoder 703 and latch driver Q3.)

Figure 12:
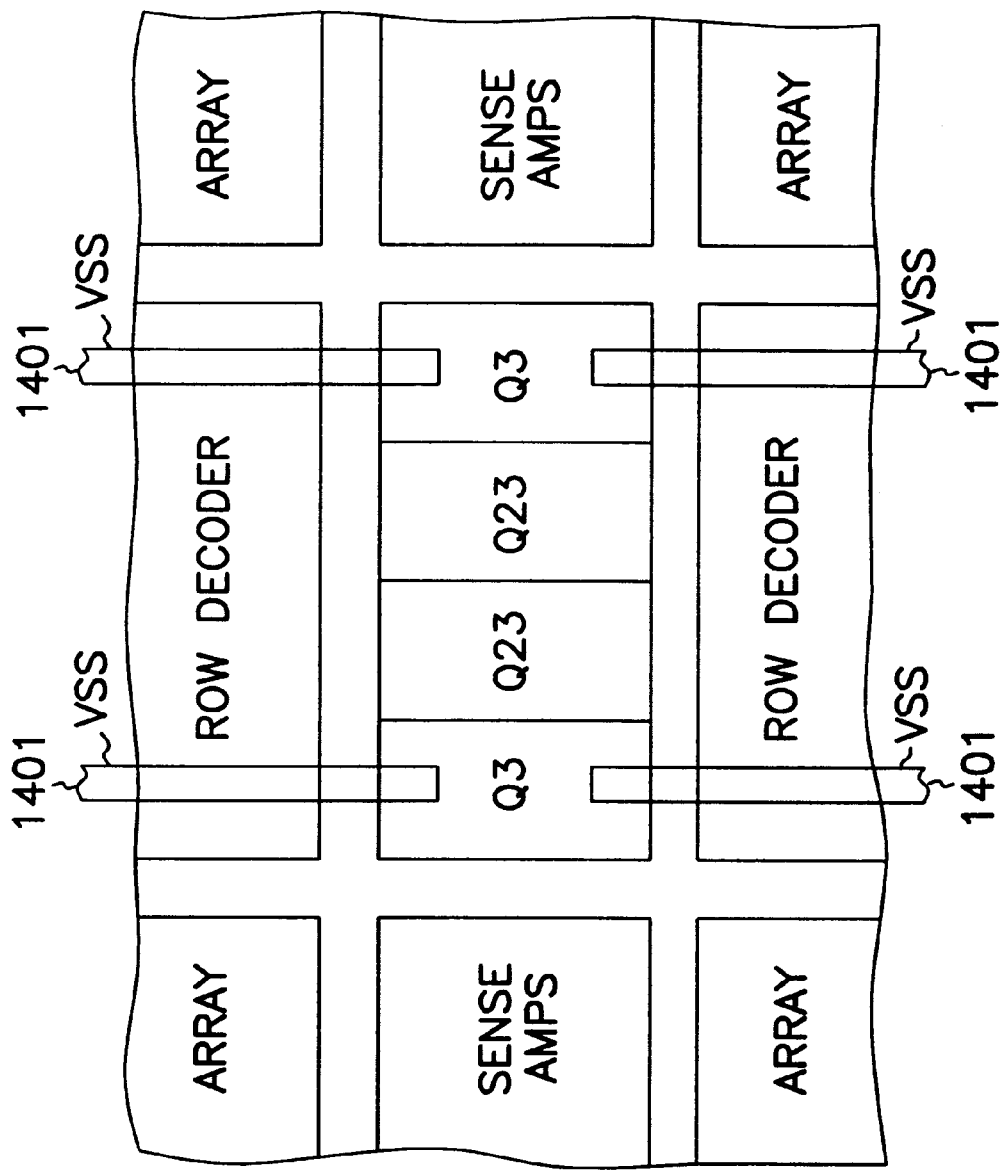
FIG. 12 is a layout diagram showing one embodiment of a DRAM design having a ground bus running through the row decoder pitch area to provide ground to the latch drivers for the n-sense amplifier.
Figure 13:
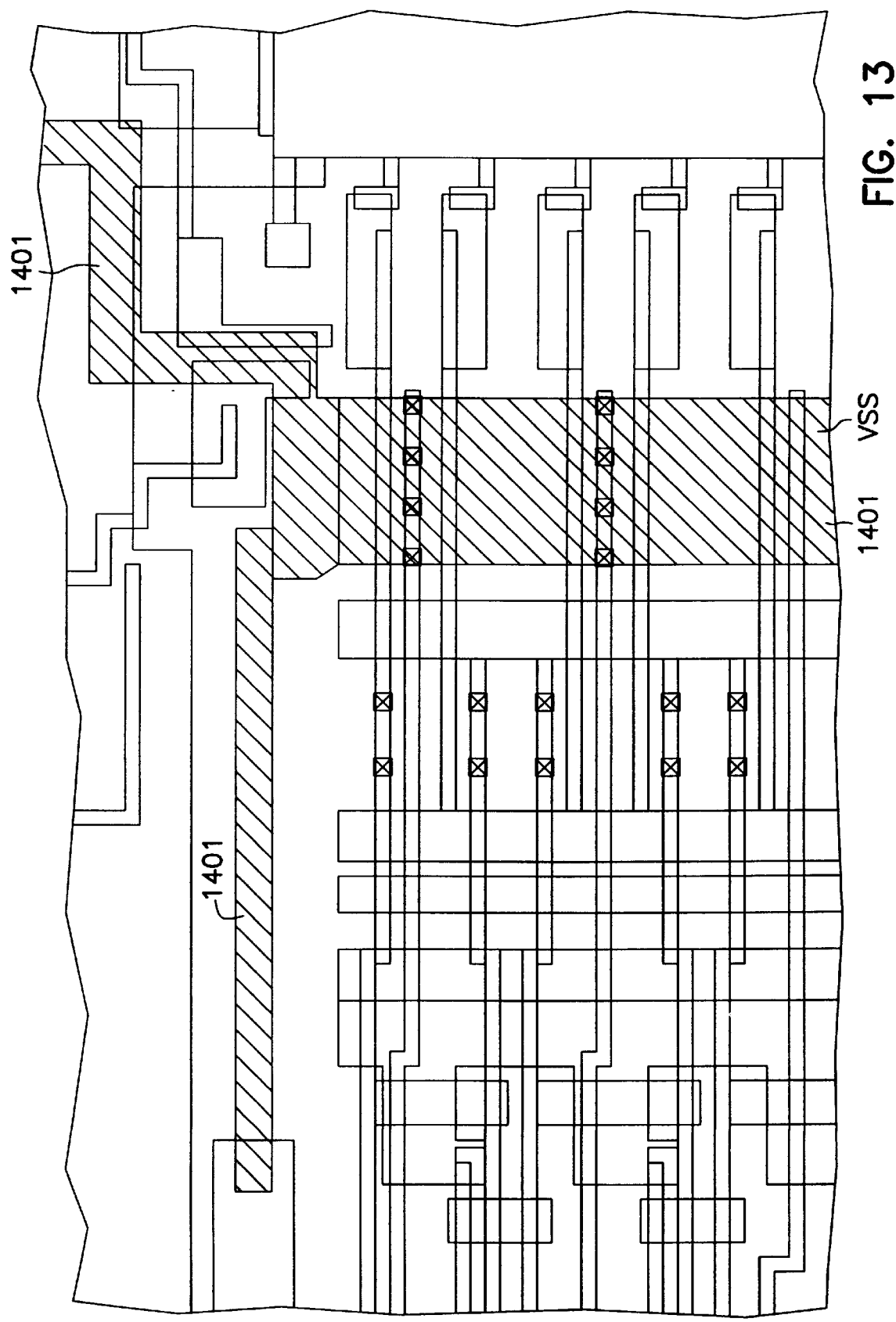
FIG. 13 is a magnified view of the ground bus of FIG. 12.

FIG. 12 is a logical block diagram showing one embodiment of a DRAM design having a ground bus running through the row decoder pitch area to provide ground to two of the latch drivers Q3 of n-sense amplifier 502. FIG. 13 shows one embodiment of a ground path 1401 such as could be used in the device of FIG. 12. In FIG. 13, a single ground path 1401 running through the row decoder splits to provide a ground potential to both sides of one of the latch drivers Q3 (Q3 is not shown in FIG. 13).

Figure 14:
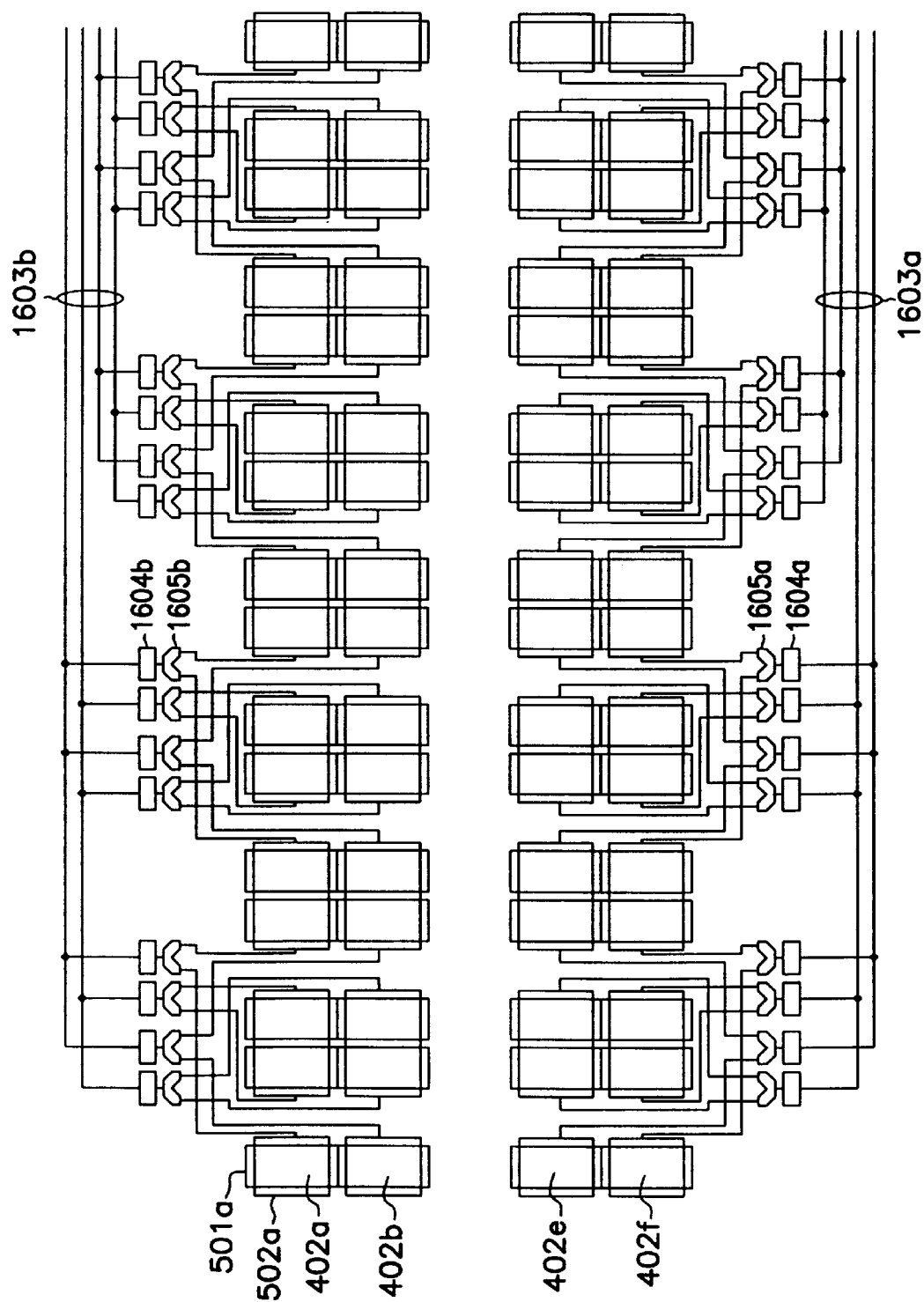
FIG. 14 is a logical block diagram of the 16 megabit single deposition layer metal DRAM of FIG. 2.

FIG. 14 is a logical block diagram of the 16 megabit single deposition layer metal DRAM of FIG. 2 showing the address and data flow of the 16 megabit single deposition layer metal semiconductor memory device 400. The memory array shown in electrical schematic form in FIG. 14 corresponds generally to the physical layout and architecture of FIG. 2. In one embodiment, address lines (not shown)

travel right to left to distribute the address signal to access a particular memory subarray (e.g., subarray 402*a*) while data travels to the top or bottom of the device. By placing the address pads on the left side and the data pads on the right side, the address and the resulting data flow from left to right across device 400. This allows the designer to form a contiguous line of memory subarrays 402 across each memory section 407 and reduces the amount of space needed for wiring the pieces of memory section 407 together.

In one such embodiment, data paths are formed on the periphery of the die. The data lines from the array are selected through multiplexors 1605 and line drive circuits 1604. Data paths 1603*a* and 1603*b* are terminated at the line drivers connected to signal bonding pads 401 which are located, in the exemplary embodiment, to the right side of the die shown in FIG. 14 since the data I/O pins are all placed on that side of the die.

32 Megabit Single Deposition Layer Metal DRAM Architecture

Figure 15:
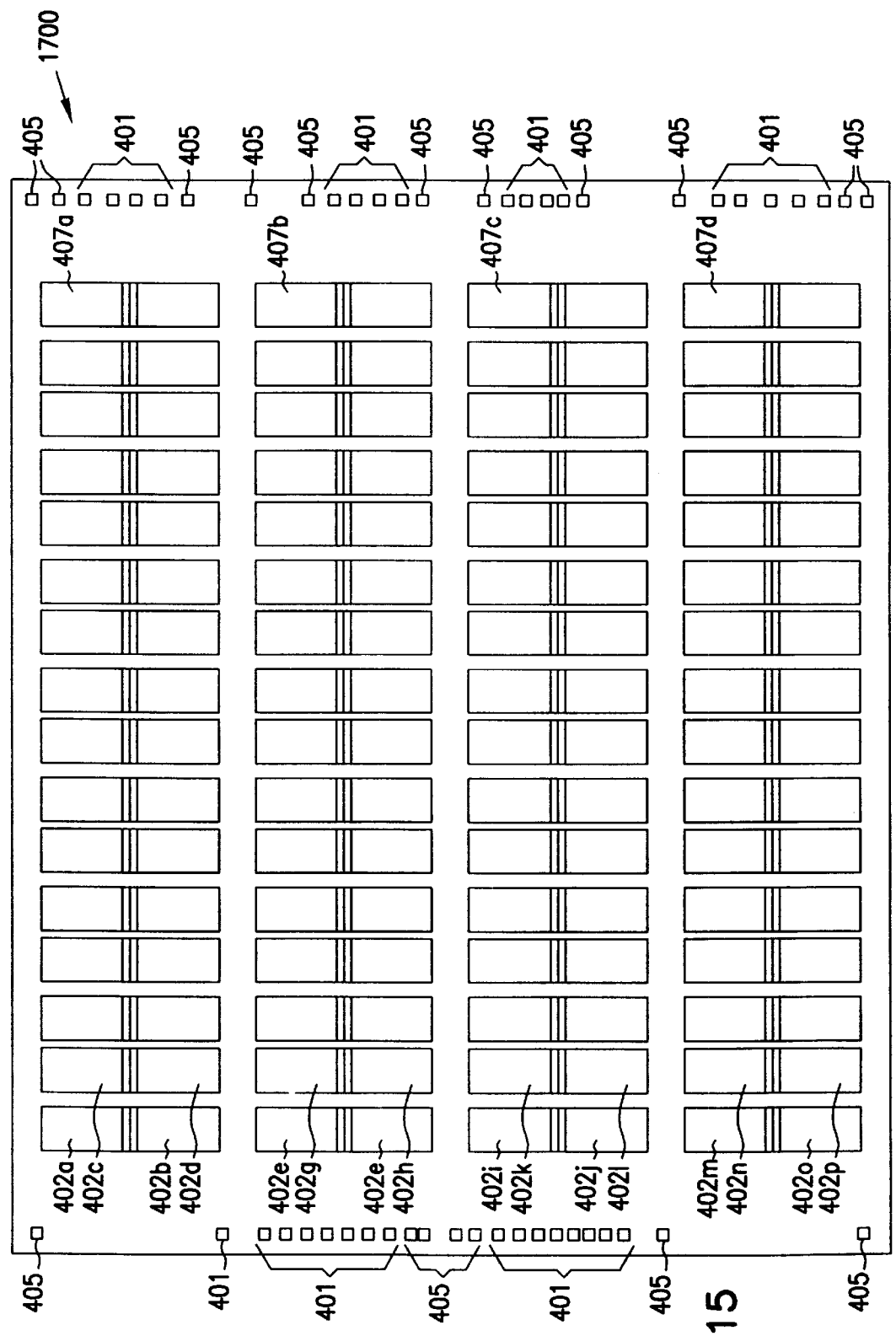
FIG. 15 is a physical layout view of the entire die surface of a 32 megabit single deposition layer metal DRAM die.

A second embodiment of a physical architecture formed according to the present invention is shown in block diagram form in FIG. 15. Semiconductor memory device 1700 includes signal bonding pads 401 and power bonding pads 405 clustered toward the ends of semiconductor memory device 1700. Such an approach produces an narrow die that can be stepped to form higher density memory devices.

The 32 Mb DRAM physical architecture shown in FIG. 15 has the memory cells and active support circuitry divided into four memory sections (407*a* through 407*d*), with I/O paths extending between each section 407. Each section 407 contains 8 Mb of memory cell area with each section divided into 32 subarrays 402 of 256 kilobits ($2^{18}$ bits) of single bit memory cells (where 1 Kb=1024 bits). Each 256 Kb cell subarray 402 is serviced by row decoders, column decoders, and sense amplifiers as is described in connection with FIG. 2 above. In one embodiment, each section 407 is a single design replicated four times across the die. Each of the sections 407 includes column decoders 703 running in a direction parallel to the ends of the device 400 on which the signal pads are formed. Such an array orientation ensures that the column decode runs between the address side and the data side in a fashion such that even as the sections are stepped across a semiconductor die, there is no increase in the column decode length. In one such embodiment, the data lines in such a column decode design come out to the outside edge of device 400 where they hit the DC sense amplifiers and are bussed to data signal pads using metal interconnect. These lines are not, however, as heavily loaded as the column decode lines and, therefore, we can still expect reasonable speed from them.

As in the 16 Mb semiconductor memory device 400 described above, only a single deposition layer of metal is used in fabricating the device. Therefore, the operational speed of memory subarrays 402 is of paramount importance. In one embodiment, signal lines are all highly conductive interconnect lines to provide rapid distribution of the data into or out of the memory arrays. In another embodiment, the digit or bit lines in the memory cell arrays are implemented in highly conductive interconnect material and the word or row lines are implemented in semiconductive material. In yet another embodiment, the word lines in the memory cell arrays are implemented in a highly conductive interconnect material and the bit lines are implemented in semiconductive material.

Since the use of the highly conductive interconnect is limited to one deposition step, more of the pitch cell interconnect is implemented in diffusion layers and polysilicon. This is necessarily a slower signal path than metal due to the increased resistance and capacitance of such an interconnect To minimize the need for long run lengths of interconnect, the memory cell areas are subdivided into small regions. With more subdivisions of cell area, more pitch cells are required to service those cell areas. But within the global restriction of a die size remaining approximately the same size as prior art multiple metal layer DRAM parts, the size of the cell areas in the present invention is reduced and the pitch cells are closely spaced and staggered to conserve space.

One advantage of the design of semiconductor memory device 1700 is that it presents a partial option for recovering some portion of the memory device in the event that one or more memory sections 407 are unusable. If one or two memory sections 407 are tested at the die level and found to be unusable, device 1700 can be patched to form a 16 MB memory device in order that the device not be a total loss.

Figure 16:
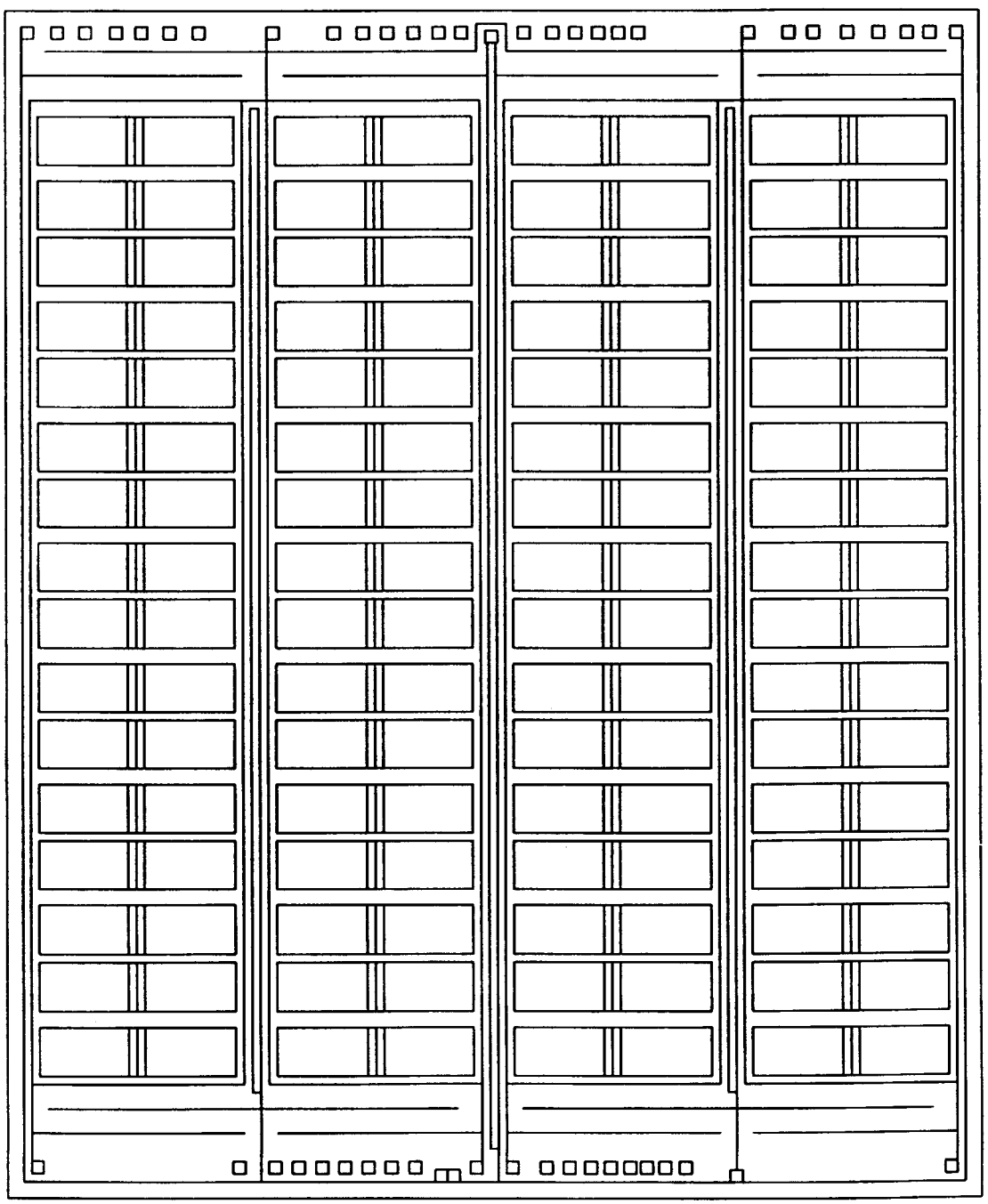
FIG. 16 is a top down view of the surface of the 32 megabit single deposition layer metal DRAM of FIG. 15 showing routing of power and ground.

FIG. 16 shows the on-chip power bussing architecture. Power and ground distribution generally requires substantially larger traces than signal interconnects. The power bonding pads shown in FIG. 16 correspond to the power bonding pads shown and described in conjunction with FIG. 15.

Industry Standard Packaging

Both semiconductor memory device 400 and semiconductor memory device 1700 are designed to fit within industry standard packaging. In fact, in one embodiment, device 400 fits comfortably within a 300 mil package while device 1700 requires at least a 400 mil package. One preferred pinout of semiconductor memory device 1700 is shown in FIG. 17.

CONCLUSION

What has been described are methods of manufacturing single deposition layer metal $2^{24}$ and $2^{25}$ bit DRAM devices. The method involves fabricating two or more memory sections on a wafer, wherein each memory section includes at least $2^{23}$ memory cells distributed in a plurality of memory subarrays, each of the memory subarrays containing at least $2^{18}$ memory cells. Each memory section also includes a plurality of n-sense amplifiers, a plurality of row address decoders running in a direction approximately parallel to the length of the semiconductor die and a plurality of column address decoders running in a direction approximately perpendicular to said row address decoders. At least one polysilicon interconnect layer is formed over the wafer to form a plurality of word lines interconnecting the memory cells in the memory arrays. In addition, no more than one single deposition layer of highly conductive interconnect material is deposited on the wafer in order to form pluralities of signal and power bonding pads along short sides of the semiconductor die and to connect the signal bonding pads and the power bonding pads to portions of the plurality of the memory cells, the plurality of row address decoders, the plurality of column address decoders, and the plurality of sense amplifiers. The wafer is then singulated to form a semiconductor die and the semiconductor die is inserted into a cavity of an integrated circuit package.

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. Therefore, it is manifestly intended that this invention be limited only by the claims and the equivalents thereof.

What is claimed is:

1. A method of manufacturing a memory device on a die having a short side, the method comprising the steps of:

forming one or more memory sections, wherein each memory section includes a plurality of memory subarrays, wherein the step of forming includes the steps of:

forming row decoder logic so that it runs between two or more memory subarrays and in a direction approximately perpendicular to the short side of the die;

forming n-sense amplifier logic so that it runs between two or more memory subarrays and in a direction approximately parallel to the short side of the die, wherein the n-sense amplifier logic includes an n-sense amplifier; and forming column decoder logic so that it runs between two or more memory subarrays and in a direction approximately parallel to the short side of the die;

placing pads on the short side of the die; and placing peripheral logic between the pads and the memory subsections, wherein the peripheral logic electrically connects the pads to the arrays.

2. A method of manufacturing a memory device having a plurality of row decode circuits and a plurality of column decode circuits on a die having a short side and a long side, the method comprising the steps of:

placing pads on the short side of the die;

forming memory locations within memory subsections, wherein the step of forming includes the steps of:

forming the column decode circuits so that they run in a direction approximately parallel to the short side of the die;

forming the row decode circuits so that they run in a direction approximately perpendicular to the short side of the die; and forming memory subarrays in an area between the column decode circuits and the row decode circuits; and placing peripheral logic between the pads and the arrays, wherein the peripheral logic electrically connects the pads to the arrays.

3. The method of claim 1, wherein forming row decoder logic comprises forming circuitry for controlling spare memory cell areas and fuses used to substitute good memory cell areas for areas found to be defective after manufacture.

4. The method of claim 1, wherein forming n-sense amplifier logic comprises forming circuitry for controlling spare memory cell areas and fuses used to substitute good memory cell areas for areas found to be defective after manufacture.

5. The method of claim 1, wherein forming column decoder logic comprises forming circuitry for controlling spare memory cell areas and fuses used to substitute good memory cell areas for areas found to be defective after manufacture.

6. The method of claim 1, wherein forming n-sense amplifier logic includes forming digit lines in the memory cell arrays from a highly conductive interconnect material and wherein forming row decoder logic includes forming row lines from semiconductive material.

7. The method of claim 2, wherein forming the column decode circuits comprises forming circuitry for controlling spare memory cell areas and fuses used to substitute good memory cell areas for areas found to be defective after manufacture.

8. The method of claim 2, wherein forming the row decode circuits comprises forming circuitry for controlling spare memory cell areas and fuses used to substitute good memory cell areas for areas found to be defective after manufacture.

9. The method of claim 2, wherein forming row decode circuits includes isolating transistors using grounded gate isolation.

10. A method of manufacturing a memory device on a die having a short side and a long side, comprising:

forming one or more memory sections, wherein each memory section includes a plurality of memory subarrays, including a first, second, third and fourth memory subarray;

forming a first row decoder circuit connected to said first and second memory subarrays, wherein the first row decoder circuit is placed between said first and second memory subarrays and in a direction approximately perpendicular to the short side of the die;

forming a second row decoder circuit connected to said third and fourth memory subarrays, wherein the second row decoder circuit is placed between said third and fourth memory subarrays in a direction approximately perpendicular to the short side of the die;

forming an n-sense amplifier circuit connected to the first, second, third and fourth memory subarrays, wherein the n-sense amplifier circuit includes an n-sense amplifier having a reduced parasitic resistance and wherein the n-sense amplifier circuit runs perpendicular to and between the first and second row decoder circuits; and forming a column decoder circuit connected to the first and the second memory subarrays, wherein the column decoder circuit runs approximately parallel to the n-sense amplifier circuit;

connecting a ground bus through the first row decoder circuit to the n-sense amplifier;

placing pads on the short side of the die; and placing peripheral logic between the pads and the memory subsections, wherein the peripheral logic electrically connects the pads to the arrays.

11. The method according to claim 10 wherein connecting a ground bus through the first row decoder circuit includes forming a ground bus through the column decoder circuit to the first row decoder circuit.

12. The method according to claim 10, wherein the method further comprises:

forming a second column decoder circuit connected to the third and the fourth memory subarrays, wherein the second column decoder circuit runs approximately parallel to the n-sense amplifier circuit; and forming a second ground bus through the second column decoder circuit to the second row decoder circuit; and connecting the second ground bus through the second row decoder circuit to the n-sense amplifier.

* * * * *